United States Patent
Dodd et al.

(10) Patent No.: US 6,449,213 B1
(45) Date of Patent: Sep. 10, 2002

(54) MEMORY INTERFACE HAVING SOURCE-SYNCHRONOUS COMMAND/ADDRESS SIGNALING

(75) Inventors: James M. Dodd, Shingle Springs; Michael W. Williams, Citrus Heights, both of CA (US); John B. Halbert, Beaverton; Randy M. Bonella, Portland, both of OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/664,192

(22) Filed: Sep. 18, 2000

(51) Int. Cl.$^7$ .................................................. G11C 8/00
(52) U.S. Cl. ........................................ 365/233; 365/193
(58) Field of Search ................................... 365/233, 193

(56) References Cited

U.S. PATENT DOCUMENTS 5,919,254 A * 7/1999 Pawlowski .................. 710/104
6,128,700 A * 10/2000 Hsu et al. .................... 711/122
6,172,937 B1 * 1/2001 Ilkbahar et al. ............. 365/233

FOREIGN PATENT DOCUMENTS

| JP | 0038996 | * | 3/1984 | ........... G11C/11/34 |
| JP | 0079491 | * | 5/1984 | ........... G11C/17/00 |

OTHER PUBLICATIONS

Betty Prince, "Semiconductor Memories", 1983, Wisley, 2$^{nd}$ edition, pp. 52–57.*

* cited by examiner

Primary Examiner—M. Tran
(74) Attorney, Agent, or Firm—Marger Johnson & McCollom, P.C.

(57) ABSTRACT

A memory interface scheme reduces propagation delay by utilizing source-synchronous signaling to transmit address/command information to memory devices. A memory module in accordance with the present invention may include an address/command buffer that samples address/command information responsive to an address/command strobe signal and then passes the address/command information to a memory device on the module. A retiming circuit may be used to control the timing of read-return data from a memory device on the module.

23 Claims, 3 Drawing Sheets

MEMORY INTERFACE HAVING SOURCE-SYNCHRONOUS COMMAND/ADDRESS SIGNALING

BACKGROUND OF THE INVENTION

Memory systems typically include one or more memory storage devices that are interfaced to a memory controller through a bus. The memory controller controls the exchange of data between a central processing unit (CPU) or other processing device and the memory storage device.

Data is transferred between the memory controller and memory device over a collection of signal lines that form a bus. The signal lines carry address and command signals, data signals, clock signals, and other control signals between the memory controller and memory devices. Data signals are used to exchange the actual data that is stored in, and retrieved from, the memory device. Address signals specify the location within the memory device where the data is stored. Command signals, which are sometimes multiplexed over the same signal lines as address signals, are used to transfer commands that tell the memory device which operation to perform, e.g., read, write, refresh, etc. Clock signals are used to synchronize the address, command and data signals.

One type of clocking scheme is called common clock signaling. In a common clock system, a single clock signal is distributed from a common source to two different devices that are exchanging data. Neither the sending device nor the receiving device can control when the rising or falling edges of the clock signal occur.

Another type of clocking scheme is called source-synchronous signaling. With source-synchronous signaling, the device that sends data also generates a data strobe signal that travels toward the receiving device along with the data signals. Source-synchronous signaling eliminates some problems associated with common clock systems such as propagation delay, clock skew, etc., thereby increasing the maximum operating frequency. Since the data signals for a memory device typically operate at twice or four-times the frequency of the address and command signals, source-synchronous signaling has only been used with the data lines of conventional memory devices so as to increase the operating speed of the devices.

DETAILED DESCRIPTION

Figure 1:
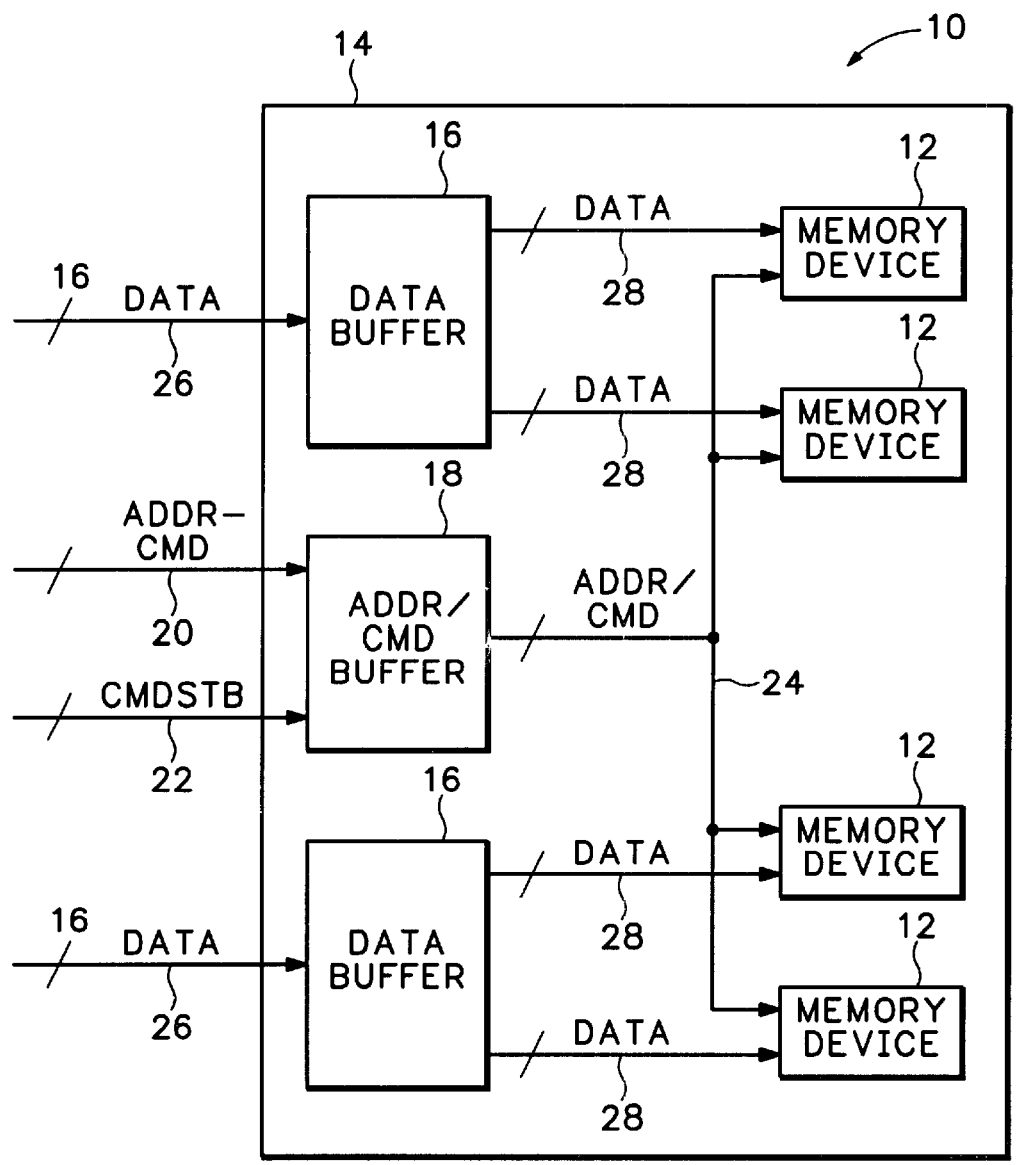
FIG. 1 is a block diagram of an embodiment of a memory module in accordance with the present invention.

FIG. 1 is a block diagram of an embodiment of a memory module in accordance with the present invention. The module 10 includes memory devices 12 mounted on a circuit board 14 which also includes two data buffers 16 and an address/command buffer 18. The address/command buffer 18 is coupled to a bus through signal lines 20, which receive the address/command signals ADDR-CMD, and through signal line 22, which receives the address/command strobe signal CMDSTB. The address/command buffer is also coupled to the memory devices through signal lines 24. In this example, the memory devices are dynamic random access memory (DRAM) integrated circuits packaged in industry-standard packages, but the present invention can be realized with other types of memory devices as well. Each of the data buffers are coupled to a bus through signal lines 26, which receive data signals DATA, and to the memory devices through signal lines 28.

The address/command buffer receives address/command information using source-synchronized signaling. This eliminates propagation delay, so no retiming is required in the address/command buffer. The address/command information passes through the address/command buffer to the memory devices over signal lines 24. (As used herein, address/command refers to address and/or command.) In a preferred embodiment, the data buffers also receive data using source-synchronized signaling.

Figure 2:
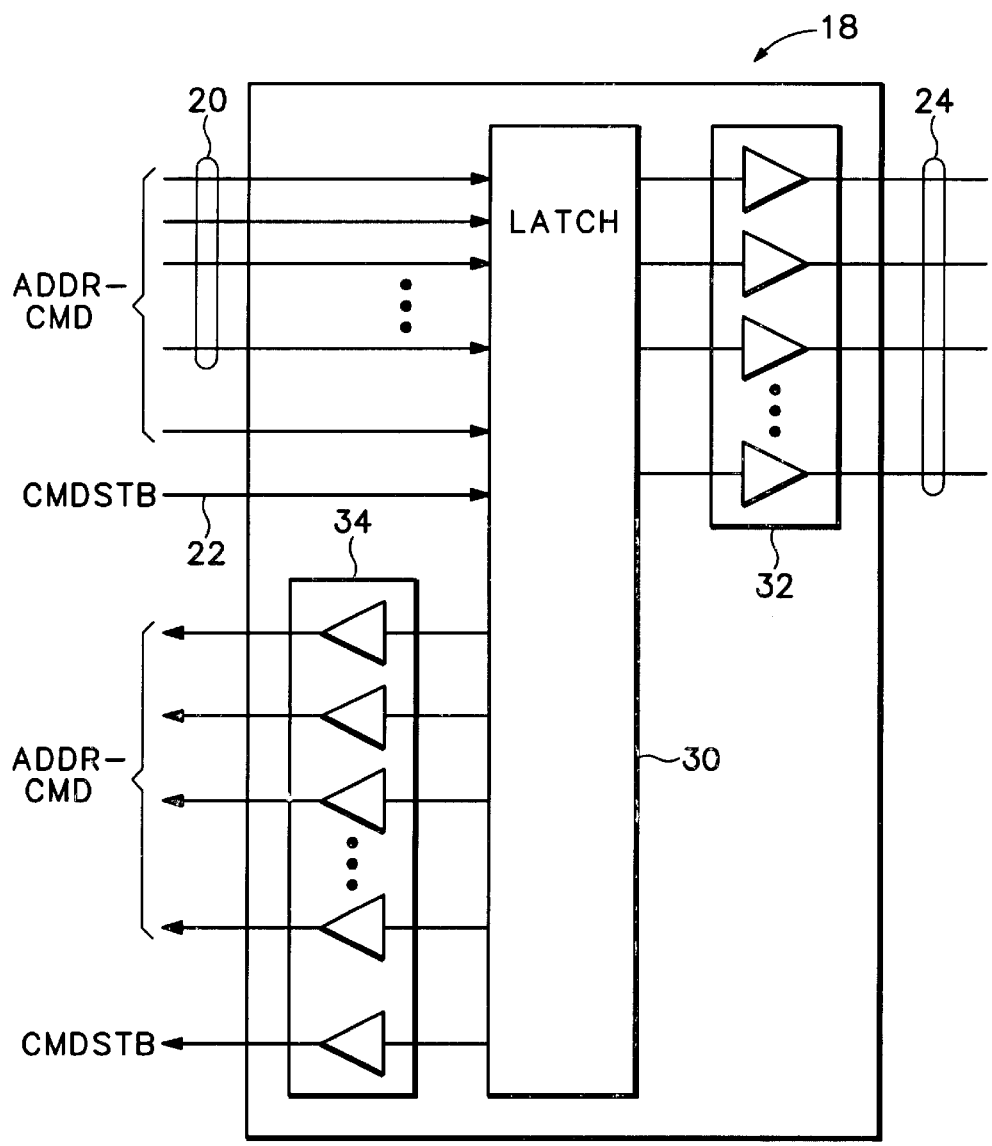
FIG. 2 is a block diagram of an embodiment of an address/command buffer in accordance with the present invention.

FIG. 2 is a block diagram of a preferred embodiment of an address/command buffer in accordance with the present invention. The address/command buffer 18 shown in FIG. 2 includes a latch 30, a first redrive circuit 32 coupled between the latch and the signal lines 24, and a second redrive circuit 34 coupled to the latch. The latch 30 samples the address/command signals responsive to the address/command strobe signal CMDSTB. The address/command information then passes to the memory devices through the redrive circuit 32 which provides adequate capability to drive multiple memory devices. The second redrive circuit 34 drives the address/command signals ADDR-CMD and the address/command strobe signal CMDSTB back out of the module where it can be used to drive the input of another memory module.

Figure 3:
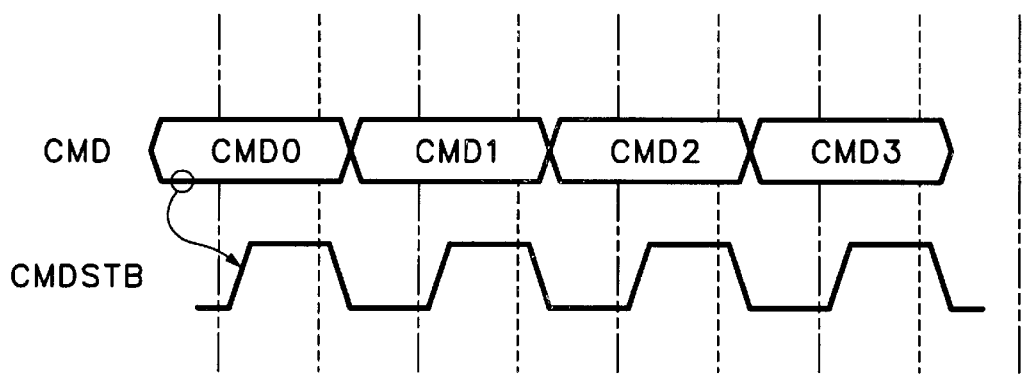
FIG. 3 is a timing diagram illustrating an embodiment of a source-synchronous address/command signaling operation in accordance with the present invention.

FIG. 3 is a timing diagram illustrating an embodiment of a source-synchronous address/command signaling operation in accordance with the present invention. In the example of FIG. 3, the commands CMD0, CMD1, etc., are transmitted on the address/command signal lines and are accompanied by corresponding pulses in the address/command strobe signal which have active edges (in this example, rising edges) that are centered on the commands. The commands and the corresponding pulses, which are typically generated by drive circuits on a memory controller, travel together to the address/command buffer 18 which samples the command at the active edge of the corresponding pulse in the strobe signal. With the embodiment shown in FIG. 2, the command is initiated by the memory device when sampled on the active edge of the command/address strobe signal. However, the present invention can also be utilized in conjunction with a retiming circuit in the address/command buffer to control the timing of read-return data initiated by a read command sampled by the memory device.

Figure 4:
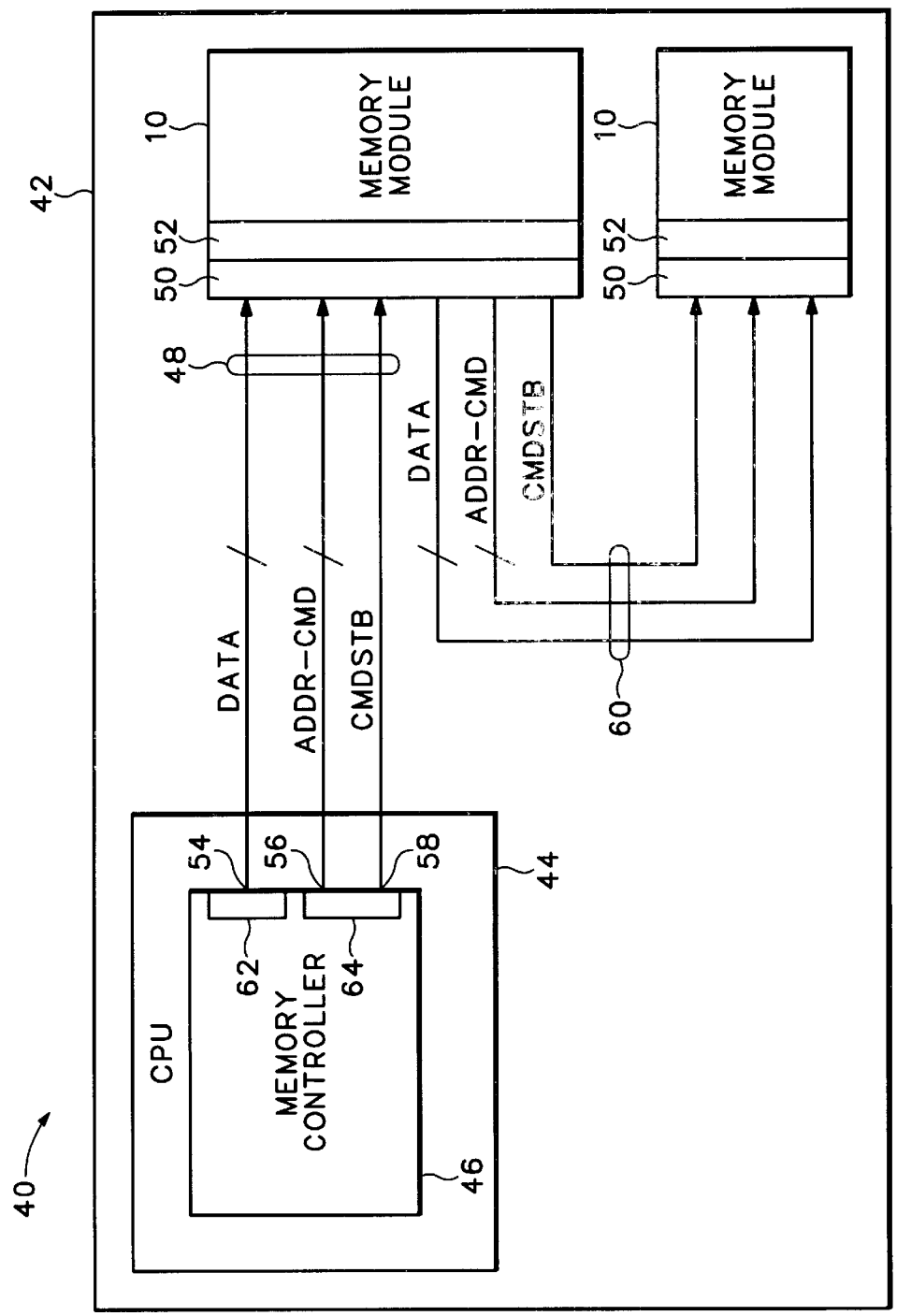
FIG. 4 is a block diagram of an embodiment of a memory system in accordance with the present invention.

FIG. 4 is a block diagram of an embodiment of a memory system in accordance with the present invention. The system shown in FIG. 4 includes a memory controller 46 which is mounted on a circuit board 42 along with one or more memory modules 10 having module connectors 52 that plug into circuit board connectors 50 on the circuit board. The memory controller 46 is shown in FIG. 4 as part of a central processing unit (CPU) 44, however, it may alternatively be implemented as one chip of a chipset, or in any other suitable form. A bus 48 includes signal traces that carry the address/command signals ADDR-CMD, the data signals DATA, the address/command strobe signal CMDSTB, and other signals to the one or more connectors 50 which couple memory modules 10 to the circuit board. The memory modules in this example send and receive all signals through the connectors.

If more than one memory module is used, they can be interfaced to the memory controller using different techniques. In the example of FIG. 4, the address, command, data, strobe, and other signals that are received by the first module are redriven, using redrive circuits such as that shown in FIG. 2, to the second module through bus 60. Alternatively, both modules may be interfaced to the memory controller using a multi-drop topology, or with any other suitable technique.

The memory controller 46 includes a data drive circuit 62 which transmits the data signals through terminals 54, and an address/command drive circuit 64 which transmits the address/command signals through terminals 56 and the address/command strobe signal through terminal 56. The address/command signals and the address/command strobe signal are source-synchronized, and in a preferred embodiment, the data signals are also source-synchronized with a data strobe signal.

Having described and illustrated the principles of the invention with some exemplary embodiments, it should be apparent that the invention can be modified in arrangement and detail without departing from such principles. For example, the memory devices need not be mounted on a memory module to realize the benefits of source-synchronous address/command signaling in accordance with the present invention. The memory devices and buffer circuits may instead be mounted directly on a circuit board such as circuit board 42 shown in FIG. 4. As a further example, the memory devices, each of which typically includes a memory cell array and an interface circuit that interfaces the cell array to the memory system, may be adapted to sample address/command information responsive to a source-synchronous strobe signal without the help of a separate address/command buffer. Alternatively, an address/command buffer in accordance with the present invention may be fabricated as part of an interface circuit in a memory device.

Additionally, the present invention is not limited to the specific numbers which are used above for purposes of illustration—different numbers of modules or memory devices, buffers, signal lines, strobe lines, etc. may be utilized. We claim all modifications and variations coming within the spirit and scope of the following claims.

What is claimed is:

1. A memory module comprising:
   a memory device; and
   an address/command buffer coupled to the memory device, wherein the address/command buffer is adapted to receive address/command information using source-synchronous signaling.

2. A memory module according to claim 1 wherein the address/command buffer comprises:
   a latch coupled to receive the address/command information; and
   a redrive circuit coupled between the latch and the memory device.

3. A memory module according to claim 1 wherein the address/command buffer comprises a redrive circuit adapted to transmit the address/command information to a second memory module using source-synchronous signaling.

4. A memory module according to claim 1 further comprising a retiming circuit coupled to the memory device and adapted to control the timing of read-return data from the memory device.

5. A memory module according to claim 1 further comprising a module connector adapted to couple the memory module to a bus.

6. A memory module according to claim 1 further comprising a data buffer coupled to the memory device.

7. A memory device comprising:
   a memory cell array; and
   an interface circuit coupled to the memory cell array, wherein the interface circuit is adapted to sample address/command information responsive to a first source-synchronous strobe signal;
   wherein the interface circuit comprises a buffer circuit adapted to receive a plurality of address/command signals responsive to the first source-synchronous strobe signal.

8. A memory device comprising:
   a memory cell array; and
   an interface circuit coupled to the memory cell array, wherein the interface circuit is adapted to sample address/command information responsive to a first source-synchronous strobe signal;
   wherein the interface circuit is adapted to receive data responsive to a second source-synchronous strobe signal.

9. A memory system comprising:
   a memory controller;
   a bus coupled to the memory controller; and
   a connector adapted to couple a memory module to the bus;
   wherein the memory controller is adapted to send address/command information over the bus using source-synchronous signaling.

10. A memory system comprising:
    a memory controller; and
    a bus coupled to the memory controller;
    wherein the memory controller is adapted to send address/command information over the bus using source-synchronous signaling; and
    wherein the memory controller comprises:
      a plurality of address/command terminals for transmitting a plurality of address/command signals; and
      a strobe terminal for transmitting a strobe signal that is source-synchronized with the plurality of address/command signals.

11. A memory system according to claim 10 wherein the bus comprises a plurality of signal lines for transmitting the plurality of address/command signals and the strobe signal over the bus.

12. A memory module comprising:
    a module connector adapted to couple the module to a memory interface;
    at least one first memory device;
    at least one second memory device;
    a first data buffer coupled between the module connector and the at least one first memory device and adapted to transmit and receive at least one first data signal through the connector;
    a second data buffer coupled between the connector and the at least one second memory device and adapted to transmit and receive at least one second data signal through the connector; and
    an address/command buffer coupled between the connector and the at least one first memory device and the at least one second memory device, wherein the address/command buffer is adapted to receive at least one address/command signal through the connector responsive to an address/command strobe signal that is source synchronized with the at least one address/command signal and pass the at least one address/command signal to the at least one first memory device and the at least one second memory device;

wherein the address/command buffer comprises a latch coupled to receive the at least one address/command signal.

13. A memory module according to claim 12 further comprising a redrive circuit coupled between the latch and the at least one first memory device and the at least one second memory device.

14. A memory module according to claim 12 wherein:

the at least one first memory device comprises a plurality of first memory devices; and the at least one second memory device comprises a plurality of second memory devices.

15. A memory module according to claim 12 wherein:

the at least one first data signal comprises a plurality of first data signals; and the at least one second data signal comprises a plurality of second data signals.

16. A memory module according to claim 12 wherein the address/command buffer further comprises a retiming circuit adapted to control the timing of read-return data from the at least one first memory device and the at least one second memory device.

17. A memory module according to claim 12 wherein the address/command buffer further includes a redrive circuit adapted to retransmit the at least one address/command signal and the address/command strobe signal back through the connector.

18. A memory system comprising:

a memory controller having at least one address/command terminal for transmitting at least one address/command signal, an address/command strobe terminal for transmitting an address/command strobe signal, at least one data terminal for transmitting at least one data signal, and a data strobe signal for transmitting a data strobe signal that is source-synchronized with the at least one data signal, wherein the memory controller is adapted to source-synchronize the address/command strobe signal with the at least one address/command signal;

a connector adapted to couple a memory module to the memory controller; and a bus coupled between the memory controller and the connector, wherein the bus includes signal lines for coupling the at least one address/command signal, the address/command strobe signal, the at least one data signal, and the data strobe signal to the connector.

19. A memory system according to claim 18 wherein:

the at least one address/command terminal comprises a plurality of address/command terminals; and the at least one address/command signal comprises a plurality of address/command signals.

20. A memory system according to claim 18 wherein:

the at least one data terminal comprises a plurality of data terminals; and the at least one data signal comprises a plurality of data signals.

21. A memory controller comprising an address/command driver circuit adapted to transmit at least one address/command signal and an address/command strobe signal, wherein:

the at least one address/command signal and the address/command strobe signal are source-synchronized;

the at least one address/command signal comprises a plurality of address/command signals; and the address/command driver circuit is adapted to source-synchronize the plurality of address/command signals with the address/command strobe signal.

22. A memory controller comprising:

an address/command driver circuit adapted to transmit at least one address/command signal and an address/command strobe signal, wherein the at least one address/command signal and the address/command strobe signal are source-synchronized; and a data driver circuit adapted to transmit at least one data signal and a data strobe signal, wherein the at least one data signal and the data strobe signal are source-synchronized.

23. A memory controller according to claim 22 wherein:

the at least one data signal comprises a plurality of data signals; and the data driver circuit is adapted to source-synchronize the plurality of data signals with the data strobe signal.

* * * * *